United States Patent
Huang et al.

(10) Patent No.: US 8,247,262 B2
(45) Date of Patent: Aug. 21, 2012

(54) METHOD FOR REDUCING CONTACT RESISTANCE OF CMOS IMAGE SENSOR

(75) Inventors: Kuan-Chieh Huang, Hsinchu (TW); Chih-Jen Wu, Hsinchu (TW); Chen-Ming Huang, Hsinchu (TW); Dun-Nian Yaung, Taipei (TW); An-Chun Tu, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 292 days.

(21) Appl. No.: 12/772,539

(22) Filed: May 3, 2010

(65) Prior Publication Data
US 2010/0279459 A1 Nov. 4, 2010

Related U.S. Application Data

(60) Provisional application No. 61/175,291, filed on May 4, 2009.

(51) Int. Cl.
*H01L 21/00* (2006.01)
(52) U.S. Cl. ........... 438/98; 438/233; 257/E21.636
(58) Field of Classification Search ............. 438/233; 257/E21.164, E21.636
See application file for complete search history.

(56) References Cited

U.S. PATENT DOCUMENTS
7,342,269 B1 * 3/2008 Yuzurihara ............. 257/292
7,897,425 B2 * 3/2011 Baek et al. ............. 438/57
* cited by examiner

*Primary Examiner* — Chandra Chaudhari
(74) *Attorney, Agent, or Firm* — Lowe Hauptman Ham & Berner, LLP (57) ABSTRACT

A method for performing a CMOS Image Sensor (CIS) silicide process is provided to reduce pixel contact resistance. In one embodiment, the method comprises forming a Resist Protect Oxide (RPO) layer on the CIS, forming a Contact Etch Stop Layer (CESL), forming an Inter-Layer Dielectric (ILD) layer, performing contact lithography/etching, performing Physical Vapor Deposition (PVD) at a pixel contact hole area, annealing for silicide formation at pixel contact hole area, performing contact filling, and defining the first metal layer. The Resist Protect Oxide (RPO) layer can be formed without using a photo mask of Cell Resist Protect Oxide (CIRPO) photolithography for pixel array and/or without silicide process at pixel array. The method can include implanting N+ or P+ for pixel contact plugs at the pixel contact hole area. The contact filling can comprise depositing contact glue plugs and performing Chemical Mechanical Polishing (CMP).

20 Claims, 8 Drawing Sheets

METHOD FOR REDUCING CONTACT RESISTANCE OF CMOS IMAGE SENSOR

CROSS-REFERENCE TO RELATED APPLICATIONS

The present application claims priority of U.S. Provisional Patent Application Ser. No. 61/175,291 filed on May 4, 2009, which is incorporated herein by reference in its entirety.

TECHNICAL FIELD

This invention is related to a CMOS Image Sensor (CIS) silicide process, more specifically using "silicide through contact hole" method to reduce pixel contact resistance.

BACKGROUND

An active-pixel sensor (APS) is an image sensor consisting of an integrated circuit containing an array of pixel sensors, each pixel containing a photodetector and an active amplifier. The CMOS APS are used most commonly in cell phone cameras, web cameras and in some Digital single-lens reflex (DSLR) cameras. Such an image sensor is produced by a CMOS process (and also known as a CMOS sensor or CIS).

A Self-Aligned Silicide (salicide) process is a process in which silicide contacts are formed only in those areas in which deposited metal (which becomes a metal component of the silicide after annealing) is in direct contact with silicon, hence, are self-aligned. This process is implemented in MOS/CMOS processes in which ohmic contacts to the source, drain, and poly-Si gate are formed.

The salicide process begins with deposition of a thin transition metal layer over fully formed and patterned semiconductor devices (e.g., transistors). The wafer is heated, allowing the transition metal to react with exposed silicon in the active regions of the semiconductor device (e.g., source, drain, gate) forming a low-resistance transition metal silicide. The transition metal does not react with the silicon oxide and/or nitride insulators present on the wafer. Following the reaction, any remaining transition metal is removed by chemical etching, leaving silicide contacts in only the active regions of the device.

Currently many CIS processes use a silicide process at the poly gate only, but not at the pixel contact. The CIS pixel contact produced without a silicide process can result in very high pixel contact resistance of more than 1000 ohm/sq, especially with the advanced technology, i.e., when the physical dimension of the CIS process technology shrinks gradually (e.g., 65 nm, 45 nm, etc.).

Also, the advanced technology will face a short channel effect (SCE) that induces a leakage concern. Short channel effect arises as the channel length L is reduced to increase both the operation speed and the number of components per chip. The short-channel effects are attributed to two physical phenomena: (1) the limitation imposed on electron drift characteristics in the channel, and (2) the modification of the threshold voltage due to the shortening channel length.

Because of SCE induced leakage, new silicide materials (e.g., Ni, Ta, Yb, Pt, or any other suitable materials and/or combinations thereof) can be possibly used for different NMOS or PMOS. For example, the current process technology for less than 65 nm resolution is a SiGe process for PMOS, which is different from an NMOS process. Therefore, contact etching will face a selective capability issue. The CIS contact-etching process needs to stop on Silicide and Si film, the two films with different etch rates. This stoppage is a challenge for the etching process of advanced technology, especially with 65 nm or less resolution. The selective capability issue can lead to an open pixel contact, i.e., a contact hole having no contact with the source or drain of CMOS devices.

Accordingly, new methods and processes for CIS are desired to reduce pixel contact resistance and to prevent high leakage and open contacts.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for CMOS Image Sensor (CIS) silicide process using a "silicide through contact hole" method to reduce the pixel contact resistance is provided. This method not only reduces pixel contact resistance (Rc), but also prevents high leakage and open contacts (i.e., contact holes having no contact with the source or drain of CMOS devices).

Throughout the various views and illustrative embodiments of the present invention, like reference numbers are used to designate like elements.

Figure 1:
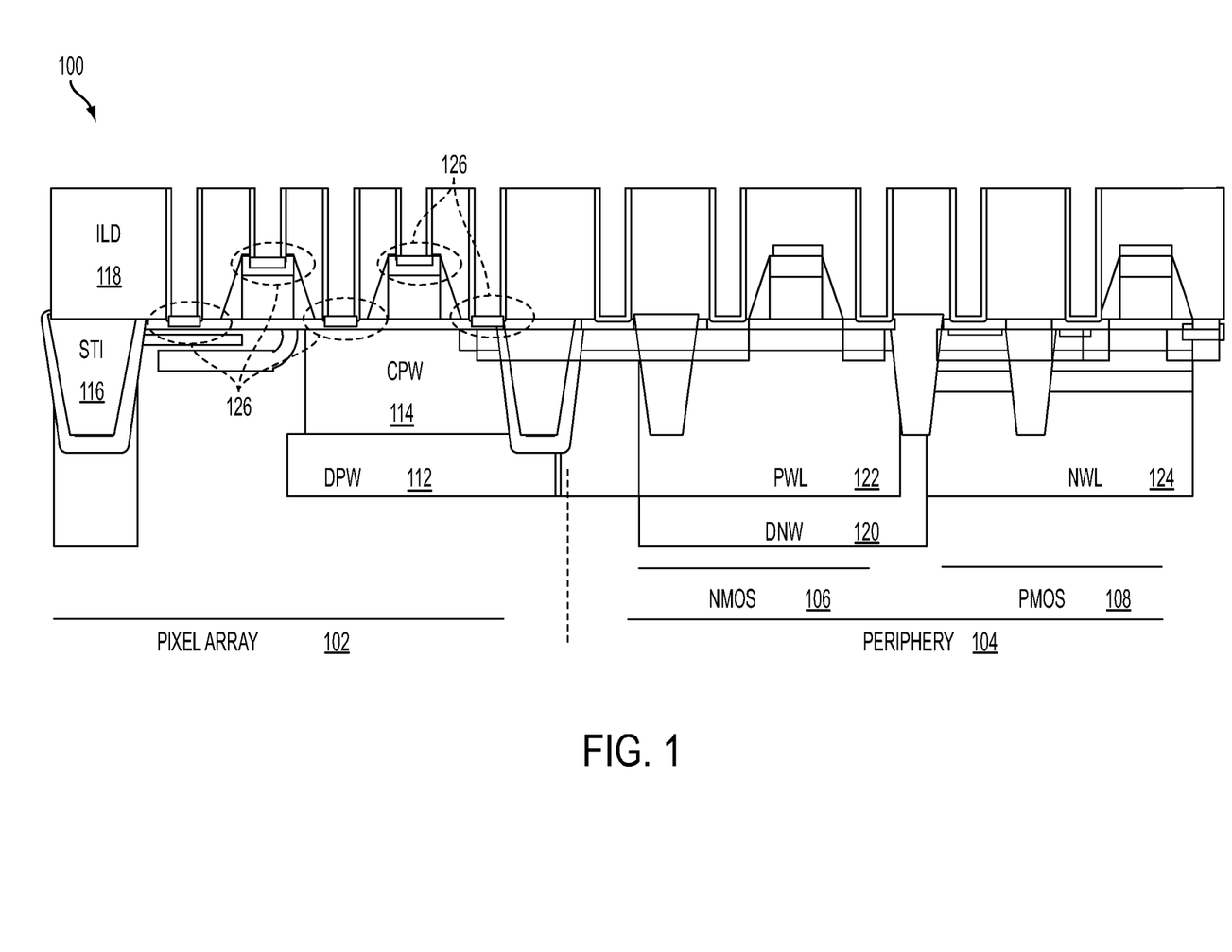
FIG. 1 illustrates an example integrated circuit structure according to one aspect of this invention.

FIG. 1 illustrates an example integrated circuit structure according to one aspect of this invention. The CIS structure 100 includes a pixel array structure 102 and a periphery structure 104, which includes an NMOS structure 106 and a PMOS structure 108. The pixel array structure 102 shows Deep P-Well (DPW) 112, Cell (pixel) P-Well (CPW) 114, Shallow Trench Isolation (STI) 116, Inter Layer Dielectric (ILD) 118, and silicide process through contact hole (after contact process) 126. The Periphery structure 104 shows Deep N-Well (DNW) 120, P-Well Layer (PWL) 122, and N-Well Layer (NWL) 124.

The structure 100 can be processed with N+ (or P+) implantation at a pixel contact hole area for a pixel contact plug to consider a Si recess. The Si recess is the loss of Si depth from contact etch process (contact hole area) and the recess depth is the trade-off between contact open without a recess and a high leakage (deeper recess), so the pixel contact hole area may need extra N+ (or P+) for improvement. The optional pixel contact plug implant is N+ (or P+), because the pixel cell is NMOS with Input/Output device only, and the implant can enhance the silicide process quality. A Physical Vapor Deposition (PVD) process using Ni, Ta, Yb, Pt, or any other suitable material and/or combinations thereof can be performed at the pixel contact hole area, and a "silicide process through contact hole" includes annealing for silicide formation at the contact hole area, which can reduce the leakage concern due to a small silicide contact area.

One embodiment of the silicide process through contact hole method reduces contact resistance (Rc) to approximately 10 ohm/sq, at least on the order of 100 times lower compared to conventional processes without silicide process for CIS pixel contact (>1000 Ohm/sq). Also the silicide process solves the open contact concern, and this process can define different silicide materials for different device needed. Further, this method does not need the current pixel array Cell Resist Protect Oxide (CIRPO) process. The method is explained in more detail in the following.

Figure 2:
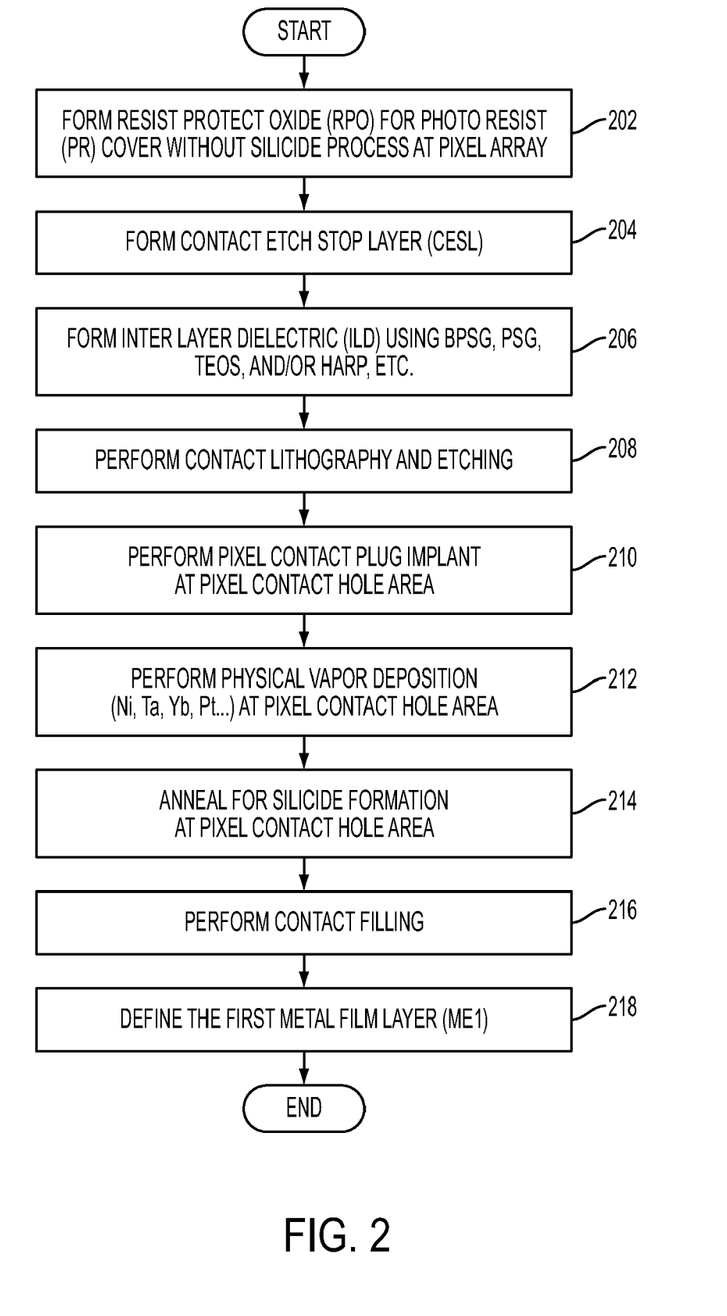
FIG. 2 illustrates a flowchart according to one embodiment of this invention.

FIG. 2 illustrates an example flowchart according to one embodiment of this invention. At step 202, Resist Protect Oxide (RPO) is formed for the photo resist (PR) cover without a silicide process at pixel array. A CIRPO photolithography photo mask is not necessary for the pixel array 102. At step 204, Contact Etch Stop Layer (CESL) is formed. CESL is used to reduce contact etch damages that can cause a leakage concern.

At step 206, Inter-Layer Dielectric (ILD) is formed. It can be processed using Boro-Phospho-Silicate Glass (BPSG), PSG (phosphosilicate glass; phosphorus doped silicon glass), TEOS (tetraethoxysilane; tetraethylorthosilicate; tetraethelorthosilicate; tetrethoxysilicide), or any other suitable material and/or combinations thereof. BPSG is silicon dioxide (silica) with boron and phosphorus added, to lower the temperature at which glass (oxide) starts to flow from about 950° C. for pure $SiO_2$ to about 500° C. for BPSG. BPSG is used to planarize the surface, and deposited by Chemical Vapor Deposition (CVD). High Aspect Ratio Plasma (HARP) etching can be used to form the contact hole area in the ILD.

At step 208, contact lithography and etching are performed. At step 210, pixel contact plug implanting is performed at the pixel contact hole area. At step 212, Physical Vapor Deposition (PVD) is performed with Ni, Ta, Yb, Pt, or any other suitable materials and/or combinations thereof, at the pixel contact hole area. PVD is a thin film deposition process in the gas phase in which source material is physically transferred in the vacuum to the substrate without any chemical reactions involved and includes evaporation (thermal and e-beam) and sputtering, commonly used to deposit metals. At step 214, annealing is performed for silicide formation at the pixel contact hole area. At step 216, contact filling is performed. At step 218, the first metal film layer (ME1) is defined. ME1 is the first metal film layer used to link contact holes (contact for source/drain and poly gate).

Figure 3A:
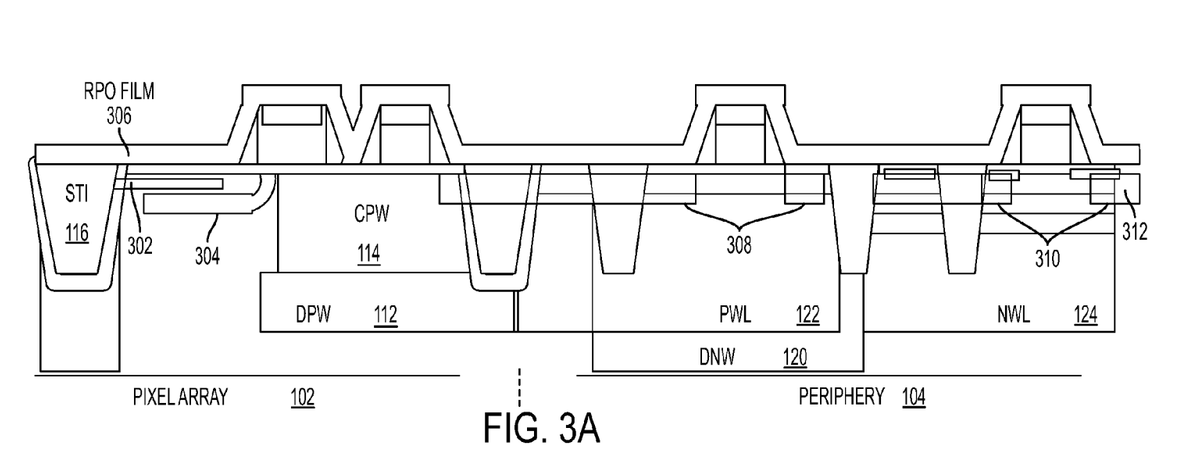
FIGS. 3A-3L illustrate exemplary steps for a CIS process according to one embodiment of this invention.

FIGS. 3A-3J illustrate exemplary steps for a CIS process according to one embodiment of this invention. In FIG. 3A, RPO (Resist Protect Oxide) film 306 is formed on top of both the pixel array structure 102 and the periphery structure 104. The exemplary pixel array structure 102 includes DPW 112, CPW 114, P+Photo Diode (PPPD) 302, and N+ Photo Diode (NPPD) 304. The exemplary periphery structure 104 includes DNW 120, PWL 122, NWL 124, NMOS-Source Drain (NSD) 308, PMOS-Source Drain (PSD) 310, and threshold voltage (VT) implant for PMOS device (VTP) 312.

Figure 3B:
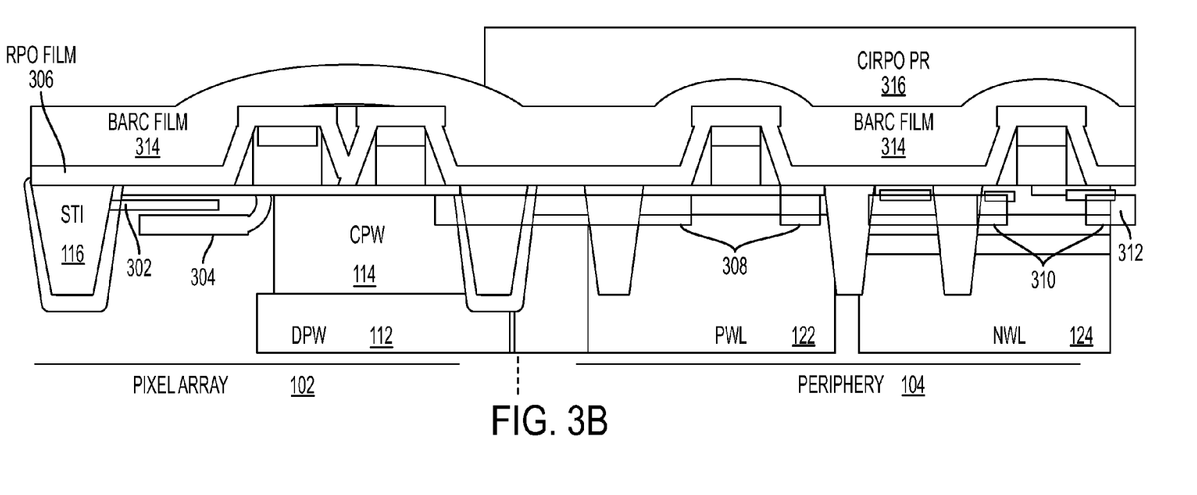

In FIG. 3B, Bottom Antireflective Coating (BARC) 314, an organic film, is formed on top of the RPO film. BARC 314 is used to enhance control of critical dimensions (CD) in advanced photolithography by suppressing standing wave effects and reflective notching caused by thin film interference. And pixel array Cell Resist Protect Oxide (CIRPO) 316 is formed to define silicide on a poly gate only. CIRPO 316 is formed on the periphery structure 104 as a protection oxide layer of pixel cell for source/drain area without a silicide process. In contrast, the CIRPO photo mask can be skipped for the pixel array structure 102. The CIRPO photo mask is only for open pixel cells and the photo resist (PR) layer covers all logic areas.

Figure 3C:
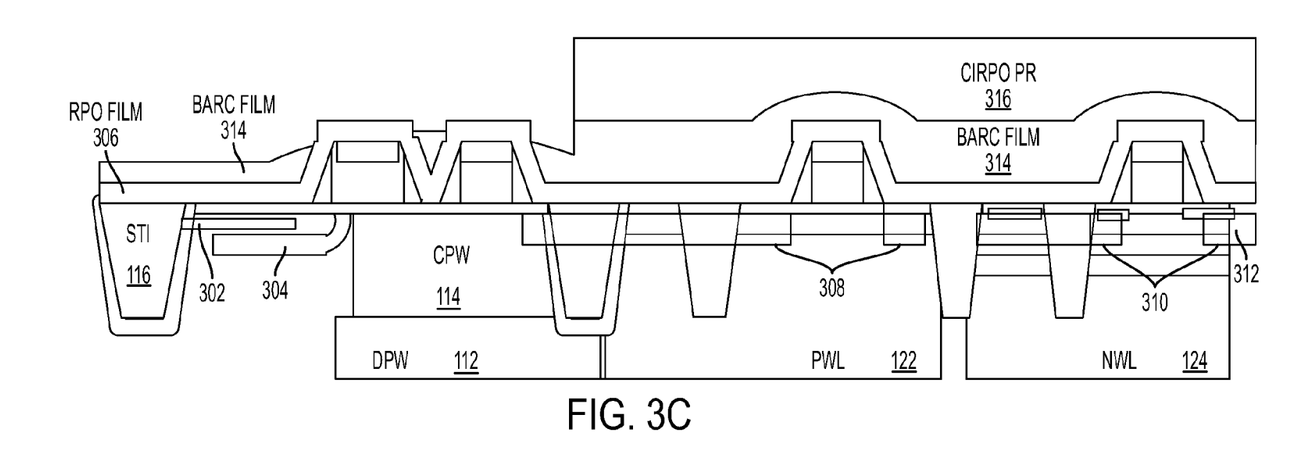
Figure 3D:
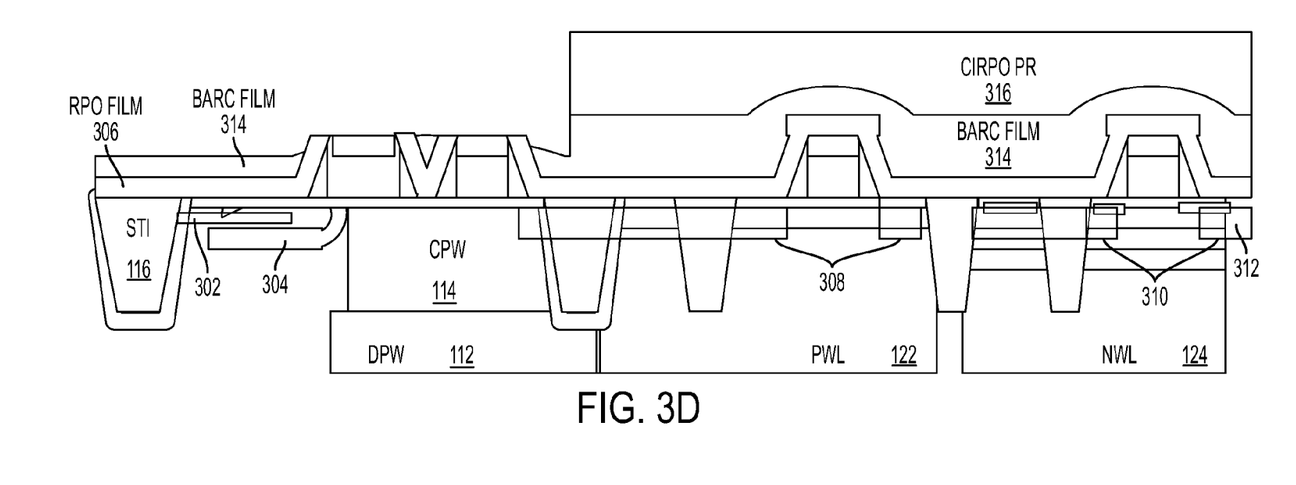

In FIG. 3C, Cell RPO Etch (CIRPO_ET) is skipped for BARC 314 on the array structure 102 side. The purpose of the Cell RPO Etch process is to define the poly gate with silicide process, Source/Drain of the device, and other Si areas without silicide process, so the etch process will remove RPO film of the poly gate and keep the RPO film of Si (Source/Drain of Device, Photo Diode) without being damaged by the BARC organic film process. The etch BARC film is used at pixel cells only. In FIG. 3D, CIRPO_ET is skipped for RPO 306 due to the pixel array's silicide film formation (Poly gate, Source/Drain of device area) with a through contact hole silicide process instead of the original Poly gate of pixel with silicide processes only by CIRPO processes (BARC, Photo, Etch). The etch oxide film is used at the pixel cell only.

Figure 3E:
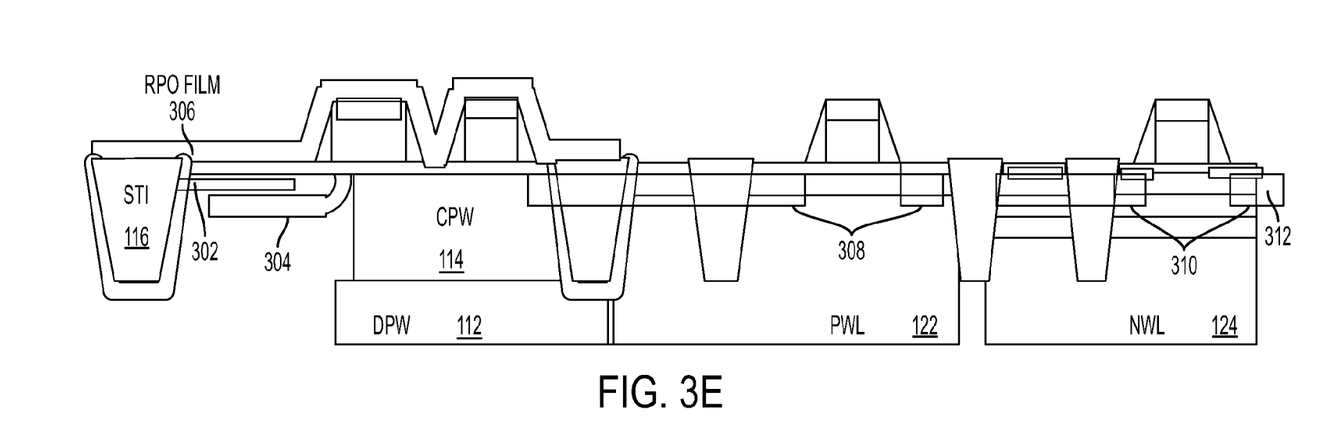
Figure 3F:
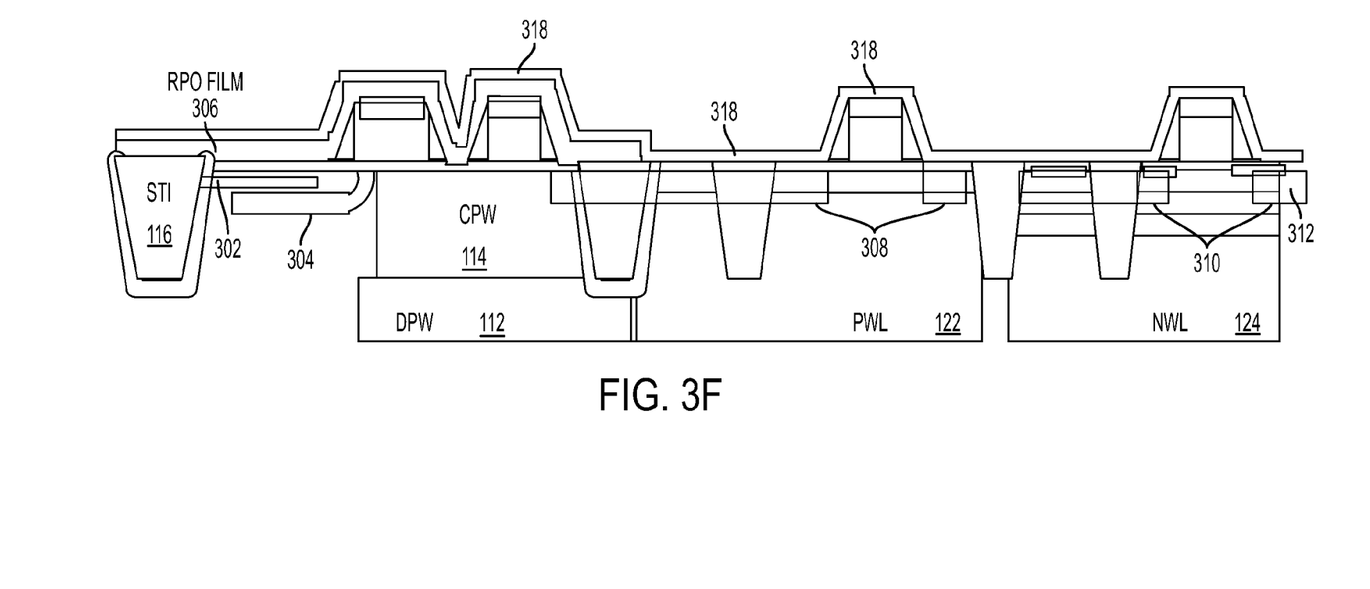

In FIG. 3E, the Resist Protect Oxide (RPO) etching is performed. The oxide can prevent a silicide process. The RPO defines low and high resistance poly silicon/oxide definition patterns. In FIG. 3F, a metal film 318 is formed for the silicide process.

Figure 3G:
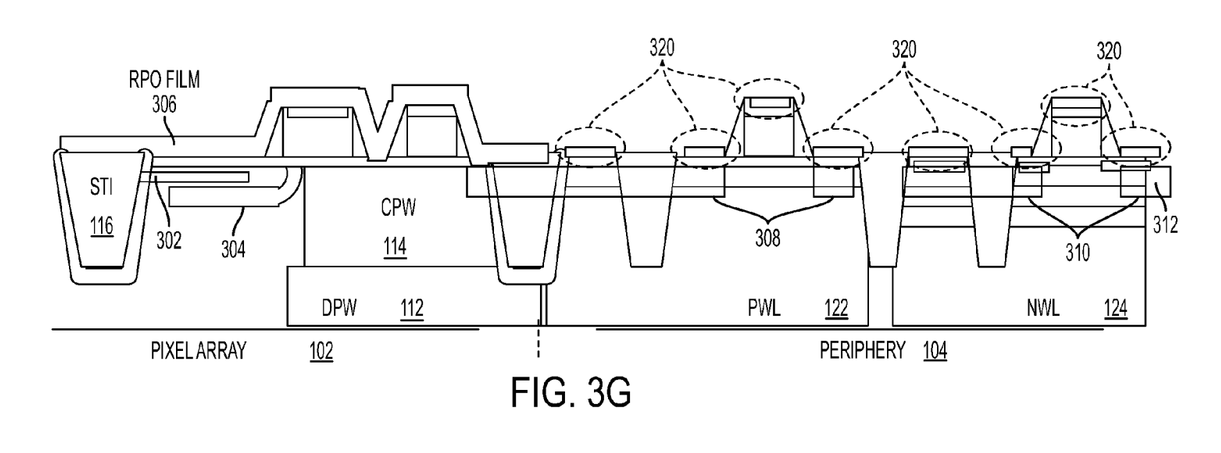
Figure 3H:
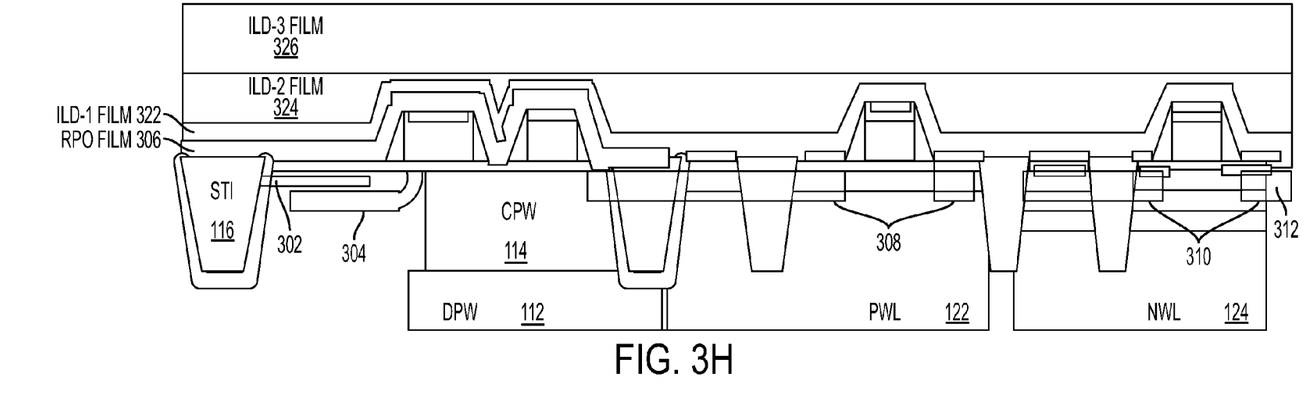

In FIG. 3G, the pixel array structure 102 shows no silicide, while the periphery structure 104 shows silicide 320 formed. In FIG. 3H, the Inter Layer Dielectric (ILD) films 322, 324, 326 are formed. The dielectric layers are used to electrically separate closely spaced interconnect lines arranged in several levels (multilevel metallization) in an advanced integrated circuit. An ILD features a low dielectric constant to minimize capacitive coupling ("cross talk") between adjacent metal lines.

Figure 3I:
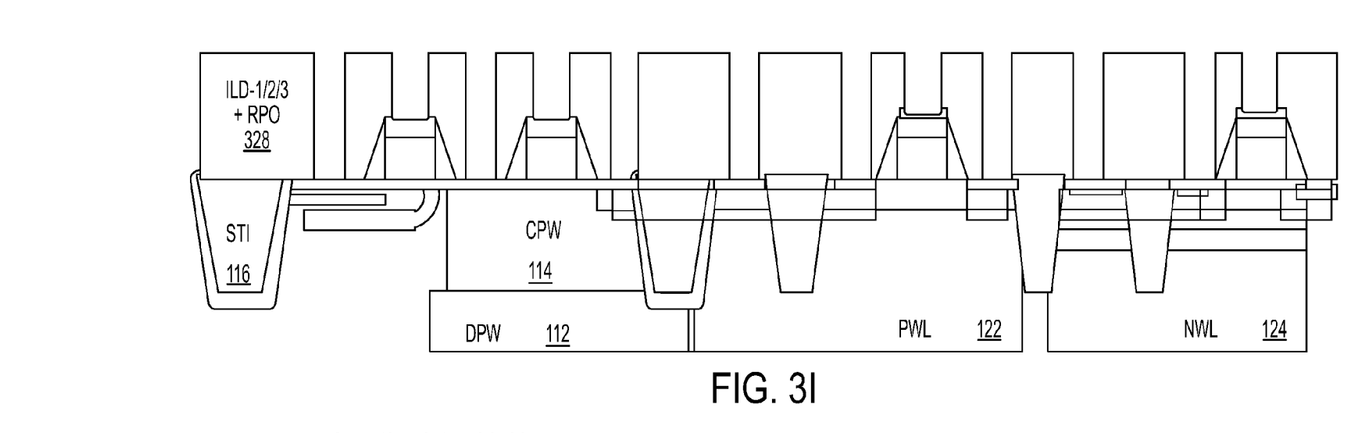
Figure 3J:
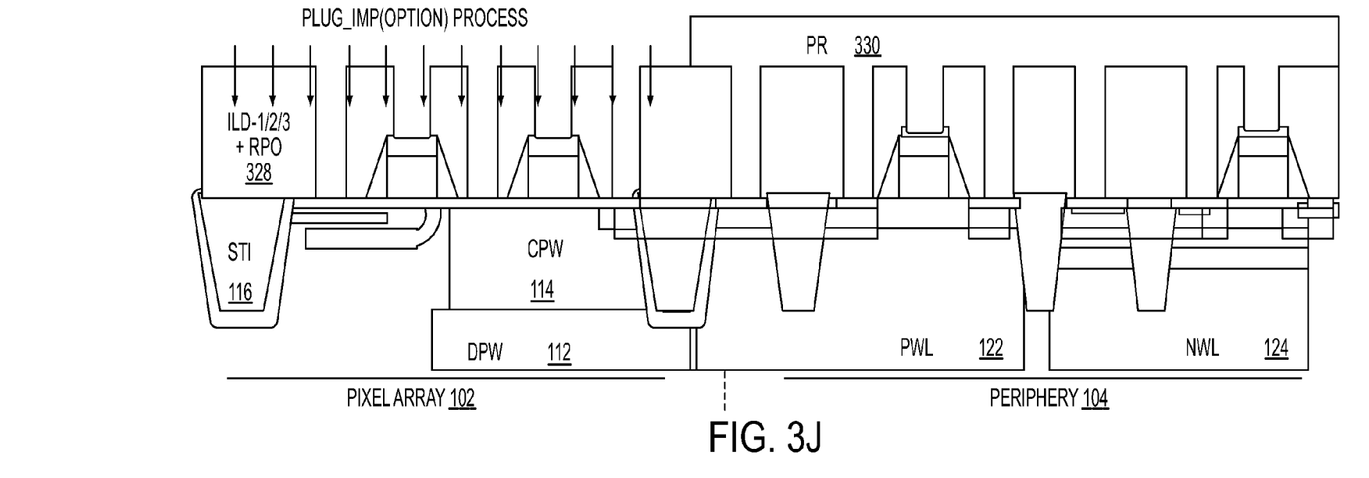

In FIG. 3I, Contact Hole (CH) photolithography and etching process is performed on layers including ILD-1/2/3 and RPO 328. In FIG. 3J, N+ (or P+) implantation at pixel contact hole area is performed for pixel contact plugs in the pixel array structure 102. Photo resist (PR) layer 330 covers the periphery structure 104 area. Because the pixel cell is NMOS with input/output device only, the plug implant is N+ (or P+). This step is optional and the implant can enhance silicide process quality.

Figure 3K:
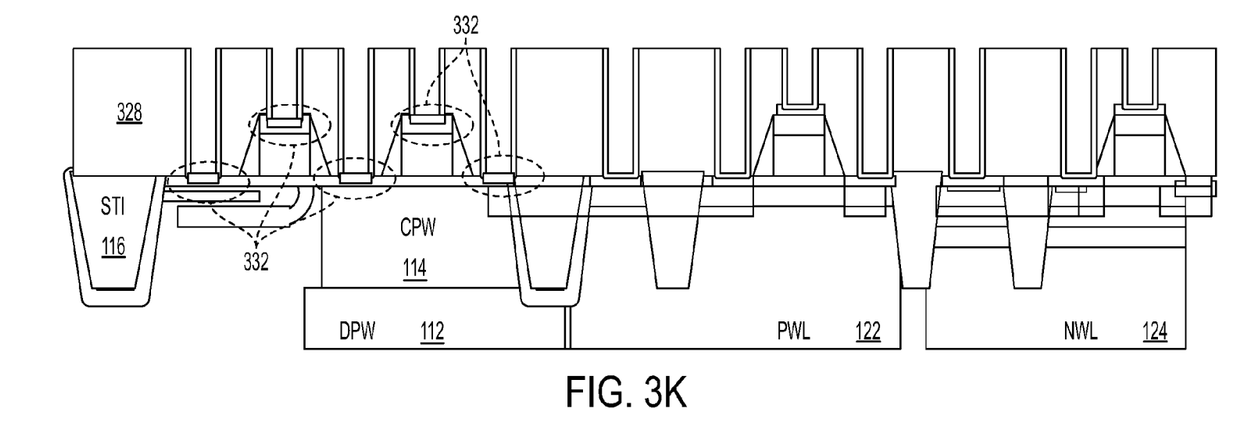
Figure 3L:
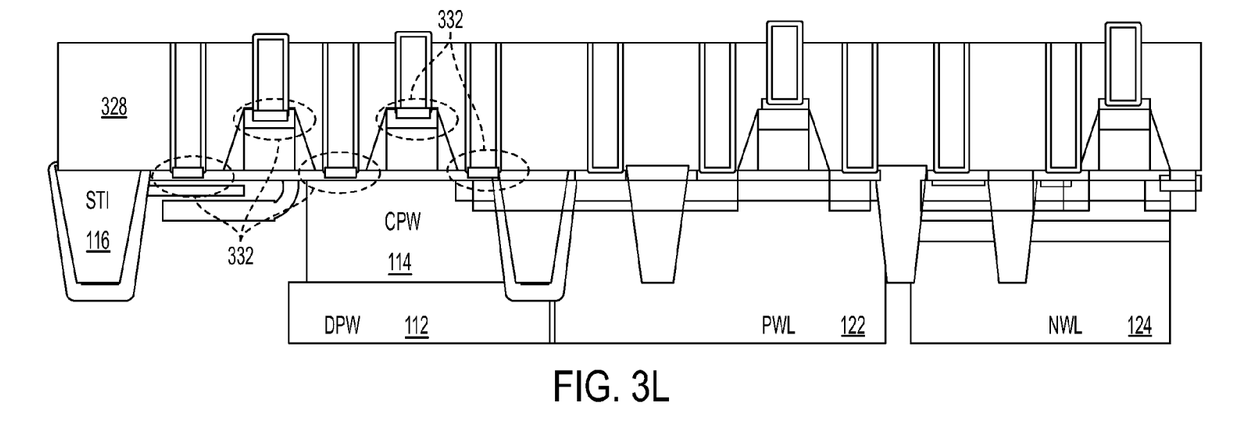

In FIG. 3K, a contact glue layer film (e.g., Ti, Ni, Ta, Yb, or any other suitable materials and/or combinations thereof) annealing process (heat treatment) is performed for silicide film formation. The silicide film 332 is formed through contact holes after the annealing process to prevent open contacts. This also reduces leakage, because of the small silicide contact area. In FIG. 3L, a contact glue plug is deposited and Chemical Mechanical Polishing (CMP) is performed for film flatness. Afterwards, a metal-1 film layer can be defined.

The advantageous features of the present invention include reduced contact resistance and leakage, as well as preventing open contacts. The silicide process through contact hole method described above solves the open contact problem at pixel cells, i.e., contact holes having no contact with source/drain of devices. The open contact problem originates from very high contact resistance Rc, and the silicide process through contact hole method lowers Rc using silicide film at contact hole only for source/drain of devices in the pixel array. In one embodiment, this method reduces Rc to approximately 10 ohm/sq, at least on the order of 100 times lower compared to a conventional process without silicide process for CIS pixel contact (>1000 Ohm/sq). Also, different silicide materials can be defined for different devices that are needed, and this method can be used instead of the current CIRPO process that requires additional masks. A skilled person in the art will appreciate that there can be many variations of the embodiments of this invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for reducing CMOS Image Sensor (CIS) contact resistance, the CIS having a pixel array and a periphery, the method comprising:
    forming a Resist Protect Oxide (RPO) layer on the CIS;
    forming a Contact Etch Stop Layer (CESL);
    forming an Inter-Layer Dielectric (ILD) layer;
    performing contact lithography and etching;
    performing Physical Vapor Deposition (PVD) at a pixel contact hole area;
    annealing for silicide formation at the pixel contact hole area; and
    performing contact filling.

2. The method of claim 1, wherein a photo mask for Cell Resist Protect Oxide (CIRPO) photolithography is not used for the pixel array.

3. The method of claim 1, wherein the Resist Protect Oxide layer is formed without a silicide process at the pixel array.

4. The method of claim 1, further comprising:
    planarizing the Inter-Layer Dielectric layer by depositing Boro-Phospho-Silicate Glass (BPSG); and
    etching the Inter-Layer Dielectric layer using a High Aspect Ratio Plasma (HARP) process.

5. The method of claim 1, further comprising implanting pixel contact plugs at the pixel contact hole area.

6. The method of claim 5, wherein the implanting for the pixel contact plugs is N+ or P+.

7. The method of claim 1, wherein the Physical Vapor Deposition (PVD) is performed with Ni, Ta, Yb, Pt, and/or combinations thereof.

8. The method of claim 1, wherein contact filling comprises depositing contact glue plugs and performing Chemical Mechanical Polishing (CMP).

9. The method of claim 1, further comprising defining a first metal film layer (ME1), wherein ME1 links contact holes for a source, a drain, or a poly gate of a CMOS device.

10. A method for reducing CMOS Image Sensor (CIS) contact resistance, the CIS having a pixel array and a periphery, the method comprising:
    forming a Resist Protect Oxide (RPO) layer on the CIS without using a photo mask of Cell Resist Protect Oxide (CIRPO) photolithography for the pixel array;
    forming a Contact Etch Stop Layer (CESL);
    forming an Inter-Layer Dielectric (ILD) layer;
    performing contact lithography and etching;
    performing Physical Vapor Deposition (PVD) at a pixel contact hole area;
    annealing for silicide formation at the pixel contact hole area;
    performing contact filling; and
    depositing a first metal film layer.

11. The method of claim 10, wherein the Resist Protect Oxide layer is formed without a silicide process at the pixel array.

12. The method of claim 10, further comprising:
    planarizing the Inter-Layer Dielectric layer by depositing Boro-Phospho-Silicate Glass (BPSG); and
    etching the Inter-Layer Dielectric layer using a High Aspect Ratio Plasma (HARP) process.

13. The method of claim 10, further comprising implanting N+ or P+ for pixel contact plugs at the pixel contact hole area.

14. The method of claim 10, wherein the Physical Vapor Deposition (PVD) is performed with Ni, Ta, Yb, Pt, and/or combinations thereof.

15. The method of claim 10, wherein contact filling comprises depositing contact glue plugs and performing Chemical Mechanical Polishing (CMP).

16. The method of claim 10, wherein the first metal film layer links contact holes for a source, a drain, or a poly gate of a CMOS device.

17. A method for reducing CMOS Image Sensor (CIS) contact resistance, the CIS having a pixel array and a periphery, the method comprising:
    forming a Resist Protect Oxide (RPO) layer on the CIS without using a photo mask of Cell Resist Protect Oxide (CIRPO) photolithography for the pixel array and without a silicide process at the pixel array;
    forming a Contact Etch Stop Layer (CESL);
    forming an Inter-Layer Dielectric (ILD) layer;
    performing contact lithography and etching;
    implanting N+ or P+ for pixel contact plugs at a pixel contact hole area;
    performing Physical Vapor Deposition (PVD) at pixel contact hole area;
    annealing for silicide formation at the pixel contact hole area;
    performing contact filling; and
    depositing a first metal film layer, wherein the first metal film layer links contact holes for a source, a drain, or a poly gate of a CMOS device.

18. The method of claim 17, further comprising:
    planarizing the Inter-Layer Dielectric layer by depositing Boro-Phospho-Silicate Glass (BPSG); and
    etching the Inter-Layer Dielectric layer using a High Aspect Ratio Plasma (HARP) process.

19. The method of claim 17, wherein the Physical Vapor Deposition (PVD) is performed with Ni, Ta, Yb, Pt, and/or combinations thereof.

20. The method of claim 17, wherein contact filling comprises depositing contact glue plugs and performing Chemical Mechanical Polishing (CMP).

* * * * *